United States Patent [19]
Sato et al.

[11] Patent Number: 5,384,088
[45] Date of Patent: Jan. 24, 1995

[54] OXIDE SUPERCONDUCTIVE MATERIAL OF Tl (THALLIUM) AND PB (LEAD) SYSTEM AND METHOD FOR MANUFACTURING THE SAME

[75] Inventors: Junichi Sato; Masahiro Seido; Akira Nomoto; Tomoichi Kamo; Katsuzo Aihara, all of Ibaraki, Japan

[73] Assignees: Hitachi Cable, Ltd.; Hitachi Ltd., both of Tokyo, Japan

[21] Appl. No.: 967,612

[22] Filed: Oct. 23, 1992

[30] Foreign Application Priority Data

Oct. 25, 1991 [JP] Japan .................. 3-279883
Oct. 8, 1992 [JP] Japan .................. 4-270207

[51] Int. Cl.⁶ .............................. B22F 3/16
[52] U.S. Cl. ........................ 505/120; 419/5;
419/8; 419/36; 419/38; 505/433; 505/434;
505/492; 505/501; 505/230; 505/236
[58] Field of Search ............ 75/0.5 C; 174/128 S;
335/216; 360/126; 428/557; 505/1, 123;
546/256; 419/5, 8, 36, 38, 32

[56] References Cited

U.S. PATENT DOCUMENTS

| | | | |
|---|---|---|---|
| 4,218,668 | 8/1980 | Tada et al. | 335/216 |
| 4,652,697 | 3/1987 | Ando et al. | 174/128 |
| 5,049,541 | 9/1991 | Uzumaki et al. | 505/1 |
| 5,096,882 | 3/1992 | Kato et al. | 505/1 |
| 5,108,915 | 4/1992 | Iino et al. | 505/1 |
| 5,109,312 | 4/1992 | Kato et al. | 360/126 |

FOREIGN PATENT DOCUMENTS

| | | |
|---|---|---|
| 0362694 | 4/1990 | European Pat. Off. |
| 0449222 | 10/1991 | European Pat. Off. |
| 1124918 | 5/1989 | Japan . |

OTHER PUBLICATIONS

Physica C, vol. 183, No. 1–3, Nov. 1991, pp. 67–72, Doi et al.
Superconductor Sci. Technology, vol. 4, No. 9, Sep. 1991, pp. 488–490, T. Doi et al.

*Primary Examiner*—Donald P. Walsh
*Assistant Examiner*—John N. Greaves
*Attorney, Agent, or Firm*—Helfgott & Karas

[57] ABSTRACT

Wire, bulk, film, etc. of a superconductive material is manufactured from a powdery precursor. The superconductive material has a superconductive crystal of 1223 phase and/or 1234 phase as a main component, and the powdery precursor comprises at least 1212 phase as a main component.

15 Claims, 1 Drawing Sheet

OXIDE SUPERCONDUCTIVE MATERIAL OF Tl (THALLIUM) AND PB (LEAD) SYSTEM AND METHOD FOR MANUFACTURING THE SAME

FIELD OF THE INVENTION

The invention relates to an oxide superconductive material of Tl (thallium) and Pb (lead) system and a method for manufacturing the same, and more particularly to, an oxide superconductive material having an improved transport critical current density property in a high magnetic field in the vicinity of a temperature of 77 K. and a method for manufacturing the same.

BACKGROUND OF THE INVENTION

Among oxide superconductive materials developed so far, it is characterized that an oxide superconductive material of Y (yttrium) system has a high pinning force, and that of Bi (bismuth) system has a property of easily satisfying a transport critical current density (defined "Jc" hereinafter) even in a high magnetic field at a temperature of 4.2 K. These oxide superconductive materials have been studied to be applied to wires, bulks, films, etc.

However, the Y system superconductive material has a disadvantage in that the temperature margin is narrow on the basis that it is used in the vicinity of 77 K., because a critical temperature thereof is in the vicinity of 93 K. It has further disadvantages in that Jc inside particles thereof is low at a high temperature, and the bonding property on the grain boundary is poor not to meet the requirement of a transport Jc.

On the other hand, 1212 phase, 1223 phase and 1234 phase are known as crystal structures including 2, 3 and 4 layers of Cu—O for a Tl system superconductive material of Tl—O single layer, the basic composition of which is Tl—Sr—Ca—Cu—O. It is known in this superconductive material that, when Tl site of the basic composition is replaced by Pb, a critical temperature is increased, and, when Sr (strontium) is replaced by Ba (barium), mono-phase is easily obtained. The highest temperature state is at 100 K. for 1212 phase, and is at 122 K. for 1223 and 1234 phases.

It is also known that 1223 phase of an oxide superconductive material of Tl and Pb system, that is, $(Tl_xPb_{1-x})_1$, $(Sr_yBa_{1-y})_2$ $Ca_2Cu_3O_2$, and 1234 phase thereof, that is $(Tl_xPb_{1-x})_1$, $(Sr_yBa_{1-y})_2$ $Ca_3Cu_4O_2$ have a large pinning force in a high magnetic field at a temperature of 77 K. and an improved transport Jc ($0 < x \leq 1$ and $0 \leq y \leq 1$).

In manufacturing oxide superconductive wires, bulks, films, etc. having the Tl and Pb single layer 1223 and/or 1234 phases as a main component, oxides or carbonates are mixed by a predetermined mole ratio, and is fired by a heating condition, according to which 1223 phase or 1234 phase becomes a main phase. Then, the fired product is pulverized to provide precursor powders (provisionally fired powders).

In manufacturing a metal-sheathed oxide superconductive wire, for instance, the precursor powders having 1223 phase and/or 1234 phase as a main component are supplied into a metal pipe which is then processed repeatedly by drawing and heating to provide a predetermined wire of Tl and Pb system.

In manufacturing a superconductive film, for another instance, the precursor powders having 1223 phase and/or 1234 phase as a main component are mixed with binder, dispersion material, diluent, etc. to provide pasted substance which is then provided in film on a metal or ceramic substrate by the doctor blade method, etc, and the substrate thus coated by the pasted substance is processed by heating.

In manufacturing a superconductive material in the form of bulk, on the other hand, the precursor powders having 1223 phase and/or 1234 phase as a main component are shaped to be a predetermined bulk article by compression, and the bulk article is heated by a predetermined temperature. This process may be repeated by predetermined times.

According to the conventional superconductive material, a starting material of which is the precursor powders having 1223 phase and/or 1234 phase as a main component to be processed by thermal and/or compression treatments, however, there are disadvantages in that finally synthesized 1223 phase and/or 1234 phase of Tl and Pb system are small granular grains, because crystal particles thereof are less grown, and in that no crystal phase is substantially oriented, and different phases are considerably found therein. For these reasons, a bonding property on the grain boundaries is poor, so that an advantage in which 1223 phase and/or 1234 phase have a large pinning force essentially is not utilized. Consequently, where a magnetic field is applied to the superconductive material at a temperature of 77 K., the transport Jc is slightly deteriorated.

Accordingly, it is an object of the invention to provide an oxide superconductive material of Tl—O system and a method for manufacturing the same in which the transport Jc property is enhanced even in the vicinity of a temperature of 77 K.

According to a feature of the invention, an oxide superconductive material of Tl and Pb system, comprises;

superconductive phase and non-superconductive phase, said non-superconductive phase being less in volume proportion than 30%, said superconductive phase being of superconductive crystals comprising Tl, Pb, Sr, Ba, Ca, and Cu and having a structure of 1223 phase and/or 1234 phase, and a long axis length of said crystal being more than 30 μm.

According to another feature of the invention, a method for manufacturing an oxide superconductive material of Tl and Pb system, comprises the steps of:

preparing a powdery precursor having a crystal structure of 1212 phase as a main component, said powdery precursor comprising Tl, Pb, Sr, Ba, Ca and Cu; and processing said powdery precursor mechanically and thermally to provide said oxide superconductive material having a crystal structure of 1223 phase and/or 1234 phase as a main component.

BRIEF DESCRIPTION OF THE DRAWINGS

The invention will be explained in more detail in conjunction with appended drawings, wherein.

DESCRIPTION OF THE PREFERRED EMBODIMENTS

[FIRST PREFERRED EMBODIMENT]

$TlO_{1.5}$, PbO, SrO, BaO, CaO and CuO are mixed to provide mixed powders by a mole ratio of 0.5:0.5:1.6:0.4:2:3. The mixed powders are fired in the air at a temperature of 820° C. for 10 hours repeatedly by twice, and the fired product is pulverized to provide provisionally fired powders (precursor powders). Then, the crystal phase of the provisionally fired powders is observed by the X-ray diffraction method, and it is confirmed that a main component thereof is of 1212 phase of Tl and Pb system and $Ca_2PbO_3$.

The powders thus prepared are supplied into a pipe of Ag (silver) having an outer diameter of 6 mm and an inner diameter of 4 mm, and the pipe filled with the powders is drawn to be a size having an outer diameter of 0.7 mm, and is rolled to provide a tape-shaped wire having a thickness of 0.15 mm. The silver-sheathed tape-shaped wire is fired in the air at a temperature of 845° C. for 50 hours, and is then pressed to have a thickness of 0.12 mm. The tape-shaped wire thus processed is fired in the air at a temperature of 845° C. for 50 hours. This tape-shaped wire is defined a specimen A.

It is confirmed that the main superconductive phase of the specimen A is 1223 phase, wherein it is considered that a reaction as defined below occurs in this preferred embodiment.

$$(Tl,Pb)_1(Sr,Ba)_2Ca_1Cu_2O_x + Ca_2PbO_4 + CuO \rightarrow (Tl,Pb)_1(Sr,Ba)_2Ca_2Cu_3O_z$$

where $Ca_2PbO_4 + CuO$ on the left side is of a liquid phase.

[FIRST COMPARISON EXAMPLE]

Oxide powders having the same composition as in the first preferred embodiment is fired in the air at a temperature of 880° C. for ten hours repeatedly by twice, and the fired powders are pulverized to provide provisionally fired powders. Crystal phase of the powders is observed by the X-ray diffraction method, and it is confirmed that a main component thereof is of 1223 phase of Tl and Pb system.

The powders are processed to provide a tape-shaped wire having a thickness of 0.15 mm in the same manner as in the first preferred embodiment. The silver-sheathed tape-shaped wire is fired in the atmosphere of oxygen at a temperature of 860° C. for 10 hours, and is then pressed to have a thickness of 0.12 mm. The tape-shaped wire is finally fired at a temperature of 900° C. for 10 hours to provide a specimen defined B. It is confirmed that a superconductive phase of the specimen B is 1223 phase of Tl and Pb system.

The specimens A and B are measured at a temperature of 77 K. with respect to the transport Jc property relative to a magnetic field applied thereto.

Figure 1:
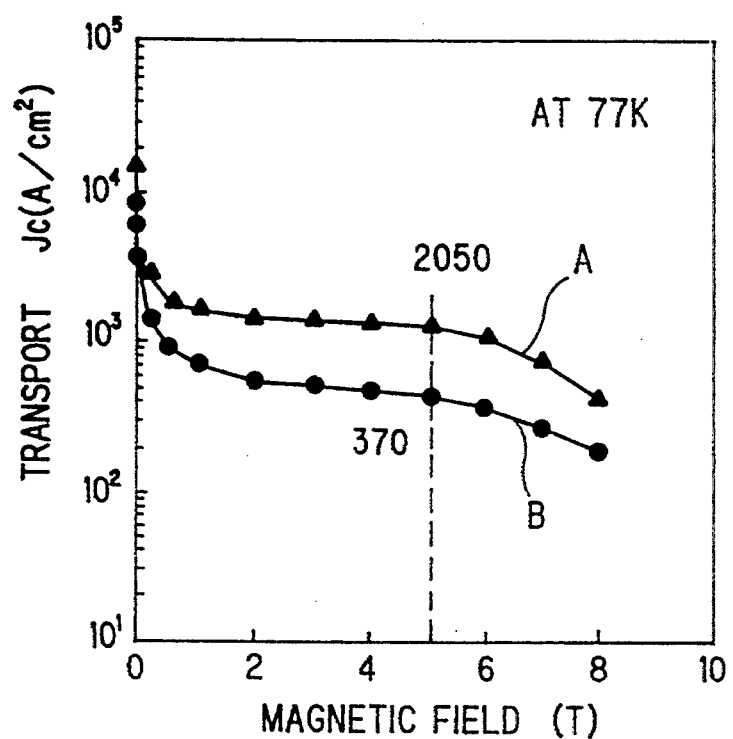
FIG. 1 is a graph showing the difference of the transport Jc properties of superconductive materials in a first preferred embodiment according to the invention and a first comparison example.

FIG. 1 shows the result of the measurement, wherein the applied magnetic field (T) is indicated along the parellel to a tape surface, and the transport Jc is indicated. As clearly understood from the result, the transport Jc is greater in the specimen A than in the specimen B, wherein that of the specimen A is 2050 ($A/cm^2$) at 5T, while that of the specimen B is 370 ($A/cm^2$) in the same magnetic field.

In accordance with the observation of structure, less impurity phase is found other than 1223 phase of Tl and Pb system, and the shape of crystal particles of 1223 phase is like plate in the specimen A, while considerable different phases are found and the shape of crystal particles of 1223 phase is like particle in the specimen B.

In accordance with the X-ray diffraction method, it is confirmed that C-plane of 1223 phase is more parallel in the specimen A to the longitudinal axis of the Ag-sheated tape-shaped wire, that is, more C-axis oriented in the specimen A than in the specimen B. In other words, plate-like crystallization and C-axis orientation are improved by synthesizing a provisionally powdery precursor consisted 1212 phase of Tl—O single layer system and $Ca_2PbO_4$. Consequently, the weak coupling of grains is improved to enhance the transport Jc in a magnetic field.

[SECOND PREFERRED EMBODIMENT]

$TlO_{1.5}$, PbO, SrO, BaO, CaO and CuO are mixed to provide mixed powders by a mole ratio of 0.5:0.5:1.6:0.4:2:3. The mixed powders are heated in the air at a temperature of 980° C. for one hour to be partially melted, and the partially melted powders are quenched on a block of Cu (copper). A preliminary product thus obtained is pulverized to be powdery, and then compressed to provide pellets. The pellets are fired in the air at a temperature of 820° C. for 20 hours, and then pulverized to provide provisionally fired powders.

Crystal phase of the powders is observed by the X-ray diffraction method, and it is confirmed that a main component thereof is 1212 phase of Tl and Pb system.

The powders are supplied into a pipe of Ag having an outer diameter of 6 mm and an inner diameter of 4 mm, and the powders in the Ag-pipe are processed in the same manner as in the first preferred embodiment by drawing, rolling, pressing and heating.

A Ag-sheathed tape-shaped wire thus obtained has an improved property of the transport Jc of 3000 $A/cm^2$ at a temperature of 77 K. in a magnetic field of 5T. This result is based on the assumption that $BaPbO_3$ is minutely dispersed at a time of quenching the partially melted powders on the Cu-block to provide a predetermined pinning force in the high magnetic field.

[THIRD PREFERRED EMBODIMENT]

$TlO_{1.5}$, PbO, SrO, BaO, CaO and CuO are mixed to provide mixed powders by a mole ratio of 0.5:0.5:1.6:0.4:1:2. The mixed powders are heated in the air at a temperature of 980° C. for 3 hours to be partially melted, and the partially melted powders are quenched on a block of Cu. A preliminary product thus obtained is pulverized to provide powders which are then compressed to provide pellets. The pellets are fired in the air at a temperature of 820° C. for 20 hours, and then pulverized to provide provisionally fired powders. Crystal phase of powders is observed by the X-ray diffraction method, and it is confirmed that a main component thereof is 1212 phase.

The provisionally fired powders, $Ca_2PbO_4$, and CuO are mixed to provide mixed powders by a mole ratio of 1:0.5:1. Then, binder, dispersion material, diluent, etc. are mixed with the mixed powders to provide pasted mixture which is supplied in film on the both surfaces of a tape of Ag having a thickness of 50 $\mu m$ by the dip coat method. The coated Ag-tape is thermally treated at a temperature of 845° C. for 30 hours. Then, the thermally treated Ag-tape is compressed by a pressure of 300 kgf/cm², and then thermally treated in the air at a temperature of 845° C. for 30 hours.

The superconductive tape thus obtained has an improved property of the transport Jc of 2900 A/cm² at a temperature of 77 K. in a magnetic field of 5T.

[FOURTH PREFERRED EMBODIMENT]

$TlO_{1.5}$, PbO, SrO, BaO, CaO and CuO are mixed to provide mixed powders by a mole ratio of 0.5:0.5:1.6:0.4:3:4. The mixed powders are fired in the air at a temperature of 820° C. for 10 hours repeatedly by twice. The fired powders are pulverized to provide provisionally fired powders. The provisionally fired powders are observed by the X-ray diffraction method, and it is confirmed that a main component thereof is of 1212 phase of Tl and Pb system and $Ca_2PbO_4$.

The provisionally fired powders are supplied into a pipe of Ag having an outer diameter of 6 mm and an inner diameter of 4 mm, and the pipe filled with the powders is drawn to be a size having an outer diameter of 0.7 mm, and then rolled to have a thickness of 0.15 mm. A Ag-sheated tape-shaped wire thus obtained is fired in the air at a temperature of 845° C. for 50 hours. Then, the tape-shaped wire is pressed to have a thickness of 0.12 mm, and then fired in the air at a temperature of 845° C. for 50 hours.

It is confirmed that a main superconductive phase of the tape-shaped wire is 1234 phase of Tl and Pb system, and has a property of the transport Jc of 2200 A/cm² at a temperature of 77 K. in a magnetic field of 5T.

[FIFTH PREFERRED EMBODIMENT]

$TlO_{1.5}$, PbO, SrO, BaO, CaO and CuO are mixed to provide mixed powders by a mole ratio of 0.5:0.5:1.6:0.4:2:3. The mixed powders are fired in the air at a temperature of 820° C. for 10 hours repeatedly by twice, and then pulverized to provide provisionally fired powders. The provisionally fired powders are observed by the X-ray diffraction method, and it is confirmed that a main component thereof is of 1212 phase of Tl and Pb system and $Ca_2PbO_4$.

The provisionally fired powders are supplied into a pipe of Ag having an outer diameter of 6 mm and an inner diameter of 4 mm, and the pipe filled with the powders is drawn to be a size having an outer diameter of 0.7 mm, and then rolled to have a thickness of 0.15 mm. A tape-shaped wire thus obtained is fired in the air at a temperature of 845° C. for 50 hours. Then, the tape-shaped wire is pressed to have a thickness of 0.12 mm, and then fired in the air at a temperature of 845° C. for 50 hours. Finally, the tape-shaped wire is pressed to have a thickness of 0.1 mm, and fired in the air at a temperature of 845° C. for 50 hours.

It is confirmed in the superconductive tape-shaped wire that the proportion of non-superconductive phase which is discriminated from 1223 phase of Tl and Pb system is less in volume than 10% by excluding the sheated Ag, and the length of long axis of superconductive crystal is 50 μm. In addition, the grains are like plate. On the other hand, the volume proportion of non-superconductive phase is 40%, and the long axis length is 5 μm in the aforementioned specimen B. Even worse, the grains are like particle.

In this fifth preferred embodiment, the transport Jc is 2400 A/cm² at a temperature of 77 K. in a magnetic field of 5T.

[SIXTH PREFERRED EMBODIMENT]

$Tl_{1.5}$, PbO, SrO, BaO, CaO and CuO are mixed to provide mixed powders by a mole ratio of 0.5:0.5:1.6:0.4:2:3. The mixed powders are fired in the air at a temperature of 800° C. for 10 hours repeatedly by twice, and then pulverized to provide provisionally fired powders. The provisionally fired powders are observed by the X-ray diffraction method, and it is confirmed that a main component thereof is of 1212 phase of Tl and Pb system and $Ca_2PbO_4$.

The provisionally fired powders are supplied into a pipe of Ag having an outer diameter of 6 mm and an inner diameter of 4 mm, and then drawn to have an outer diameter of 0.7 mm. The pipe filled with the powders is then rolled to have a thickness of 0.15 mm. The rolled tape-shaped wire is fired in the air at a temperature of 835° C. for 10 hours, and then pressed to have a thickness of 0.12 mm. Then, the tape-shaped wire is fired in the air at a temperature of 870° C. for 10 hours.

Figure 2:
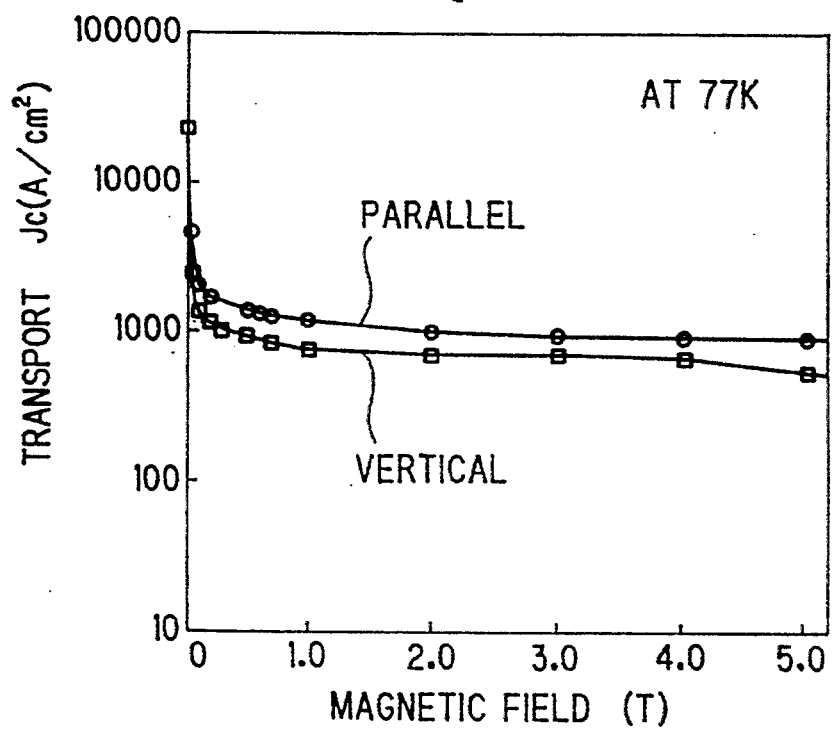
FIG. 2 is a graph showing the difference of the transport Jc properties of a superconductive tape-shaped wire which is applied with magnetic fields parallel and perpendicular to a tape surface thereof.

The transport Jc is measured as shown in FIG. 2 under the condition that an external magnetic field of 5T is applied to the superconductive tape-shaped wire thus manufactured in parallel and perpendicular directions relative to a tape surface of the superconductive tape-shaped wire at a temperature of 77 K.

As understood from FIG. 2, the transport Jc ($Jc^o$) in a magnetic field of zero is 25000 A/cm², the Jc ($JC^{5TP}$) in a magnetic field of 5T parallel to the tape surface of the tape-shaped wire is 1000 A/cm², and the Jc ($Jc^{5TV}$) in a magnetic field of 5T perpendicular to the tape surface thereof is 500 A/cm₂. That is, where a magnetic field perpendicular to the main plane thereof is applied thereto, the Jc is lowered as compared to a case where a parallel magnetic field is applied thereto. Even in the worse case, a ratio between $Jc^{5TV}$ and $Jc^o$ is 0.02 (500/2500) in this preferred embodiment.

[SECOND COMPARISON EXAMPLE]

$BiO_{1.5}$, PbO, SrO, CaO and CuO are mixed to provide mixed powders by a mole ratio of 1.8:0.4:2.0:2.0:3.0. The mixed powders are fired in the air at a temperature of 800° C. for 10 hours repeatedly by twice, and then pulverized to provide provisionally fired powders. The provisionally fired powders are supplied into a pipe of Ag having an outer diameter of 6 mm and an inner diameter of 4 mm. The Ag-pipe filled with the powders is drawn to have an outer diameter of 0.7 mm, and rolled to have a thickness of 0.15 mm.

A tape-shaped wire thus obtained is fired in the air at a temperature of 840° C. for 50 hours, and then pressed by a pressure of 300 kgf/mm². The pressed tape-shaped wire is fired in the air at a temperature of 840° C. for 50 hours.

It is confirmed in the tape-shaped wire thus manufactured that the transport Jc is 20000 A/cm² in a magnetic field of zero ($Jc^o$), and 0 in a magnetic field of 0.8T perpendicular to a main plane thereof ($Jc^{0.8TV}$). Thus, a ratio between $Jc^o$ and $Jc^{0.8TV}$ is 0 (0/20000).

As apparent from the above descriptions, a superconductive material of the invention has a large ratio of the transport Jc values obtained between under a non-magnetic field applied state and a magnetic field applied state, so that the transport Jc property is largely improved in a magnetic field. For this reason, a superconductive material of the invention is applied, for instance, to a superconductive magnet wire, etc. which are used in a high magnetic field of more than 5T.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for manufacturing an oxide superconductive material of Tl and Pb system, comprising the steps of:
   preparing a powdery precursor having a crystal structure of 1212 phase as a main component, said powdery precursor comprising Tl, Pb, Sr, Ca and Cu; and
   processing said powdery precursor mechanically and thermally to provide said oxide superconductive material having a crystal structure of 1223 phase and/or 1234 phase as a main component.

2. A method for manufacturing an oxide superconductive material of Tl and Pb system, according to claim 1, wherein:
   said powdery precursor further comprises Ba.

3. A method for manufacturing an oxide superconductive material of Tl and Pb system, according to claim 1, wherein:
   said crystal structure of said powdery precursor further comprises $Ca_2PbO_4$.

4. A method for manufacturing an oxide superconductive material of Tl and Pb system, comprising the steps of:
   preparing a powdery precursor having a crystal structure of 1212 phase as a main component, said powdery precursor comprising Tl, Pb, Sr, Ba, Ca and Cu;
   supplying said powdery precursor into a metal pipe having predetermined outer and inner diameters;
   processing said metal pipe to be drawn, rolled an/or pressed, and heated at a predetermined temperature for a predetermined time, said powdery precursor being processed to provide said oxide superconductive material having a crystal structure of 1223 phase and/or 1234 phase as a main component.

5. A method for manufacturing an oxide superconductive material of Tl and Pb system, comprising the steps of:
   preparing a powdery precursor having a crystal structure of 1212 phase as a main component, said powdery precursor comprising Tl, Pb, Sr, Ba, Ca and Cu;
   mixing said powdery precursor with binder, dispersion material and diluent to provide pasted precursor;
   coating said pasted precursor on a tape member to be applied with pressure and heated, thereby providing said oxide superconductive material having a crystal structure of 1223 phase and/or 1234 phase as a main component.

6. A method for manufacturing an oxide superconductive material of Tl and Pb system, comprising the steps of:
   preparing a powdery precursor having a crystal structure of 1212 phase as a main component, said powdery precursor comprising Tl, Sr, Ba, Ca and Cu;
   compressing said powdery precursor to provide a bulk having a predetermined shape; and
   firing said bulk to provide said oxide superconductive material having a crystal structure of 1223 phase and/or 1234 phase as a main component.

7. A method for manufacturing an oxide superconductive material of Tl and Pb system, according to claim 5, wherein:
   said powdery precursor further comprises Ba, and said crystal structure of said powdery precursor comprises $Ca_2PbO_4$.

8. An oxide superconductive material, comprises:
   superconductive phase and non-superconductive phase, said non-superconductive phase being less in volume proportion than 30%, said superconductive phase being of superconductive crystals comprising Tl, Pb, Sr, Ca and Cu and having a structure of 1223 phase and/or 1234 phase, and a long axis length of said crystal being more than 30 $\mu$m.

9. An oxide superconductive material, according to claim 8, wherein:
   said crystal further comprises Ba.

10. An oxide superconductive material, according to claim 8, wherein:
    said superconductive and non-superconductive phases are covered by an outer metal layer.

11. An oxide superconductive material, according to claim 8, wherein:
    said superconductive and non-superconductive phases are supported on a metal tape.

12. A method for manufacturing an oxide superconductive material of Tl and Pb system, according to claim 2, wherein:
    said crystal structure of said powdery precursor further comprises $Ca_2PbO_4$.

13. A method for manufacturing an oxide superconductive material of Tl and Pb system, according to claim 6, wherein:
    said powdery precursor further comprises Ba, and said crystal structure of said powdery precursor comprises $Ca_2PbO_4$.

14. An oxide superconductive material, according to claim 9, wherein:
    said superconductive and non-superconductive phases are covered by an outer metal layer.

15. An oxide superconductive material, according to claim 9, wherein:
    said superconductive and non-superconductive phases are supported on a metal tape.

* * * * *